US012801988B2

(12) United States Patent
Lammie et al.

(10) Patent No.: US 12,801,988 B2
(45) Date of Patent: Nov. 17, 2026

(54) CONDUCTANCE RANGE OPTIMIZATION

(71) Applicant: International Business Machines Corporation, Armonk, NY (US)

(72) Inventors: Corey Liam Lammie, Kilchberg (CH); Manuel Le Gallo-Bourdeau, Horgen (CH); Benedikt Kersting, Zurich (CH); Abu Sebastian, Adliswil (CH); Julian Röttger Büchel, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 719 days.

(21) Appl. No.: 18/216,661

(22) Filed: Jun. 30, 2023

(65) Prior Publication Data

US 2025/0005431 A1 Jan. 2, 2025

(51) Int. Cl.
*G06N 20/00* (2019.01)
*G11C 13/00* (2006.01)

(52) U.S. Cl.
CPC ........... *G06N 20/00* (2019.01); *G11C 13/004* (2013.01); *G11C 2213/79* (2013.01)

(58) Field of Classification Search
CPC ........ G06N 20/00; G06N 3/045; G06N 3/065; G06N 3/08; G11C 13/004; G11C 2213/79; G11C 11/54; G11C 13/0026
See application file for complete search history.

(56) References Cited

U.S. PATENT DOCUMENTS 10,496,374 B2 12/2019 Hu et al.
11,404,106 B2 8/2022 Papageorgiou et al.
11,637,561 B2 4/2023 Chao
(Continued)

FOREIGN PATENT DOCUMENTS

CN 114496013 A 5/2022
WO 2021/083154 A1 5/2021
(Continued)

OTHER PUBLICATIONS

United States Patent And Trademark Office, Notice of Allowance , Dec. 4, 2025, 14 pages, U.S. Appl. No. 18/433,782.
(Continued)

*Primary Examiner* — Akm Zakaria
(74) *Attorney, Agent, or Firm* — SCULLY, SCOTT, MURPHY & PRESSER, P.C.; Edward Wixted

(57) ABSTRACT

Systems and methods for optimizing conductance ranges of a plurality of unit cells are described. A processor can define a plurality of initial conductance ranges for a plurality of unit cells arranged in a crossbar arrangement. The plurality of unit cells can include non-volatile memory (NVM) devices. An initial conductance range is defined per column of unit cells in the crossbar arrangement. The processor can use the plurality of initial conductance ranges to encode parameter values in a circuit model of the analog memory device. The processor can input a plurality of sample inputs into the circuit model to determine an output current distribution correlated to a plurality of products between the plurality of sample inputs and the parameter values. The processor can determine, based on at least one property of the output current distribution, an optimal conductance range for the plurality of unit cells.

20 Claims, 6 Drawing Sheets

300

(56) References Cited

U.S. PATENT DOCUMENTS

| | | | | |
|---|---|---|---|---|
| 2019/0294416 | A1 | 9/2019 | Hu et al. | |
| 2020/0380349 | A1 | 12/2020 | Rasch et al. | |
| 2021/0383203 | A1 | 12/2021 | Kim et al. | |
| 2021/0406672 | A1* | 12/2021 | Hoang | G06N 3/063 |
| 2022/0028444 | A1* | 1/2022 | Papageorgiou | G06N 3/048 |
| 2022/0158651 | A1 | 5/2022 | Chao | |
| 2022/0180164 | A1 | 6/2022 | Rasch | |
| 2022/0188628 | A1 | 6/2022 | Rasch et al. | |
| 2022/0277199 | A1 | 9/2022 | Gao et al. | |
| 2022/0318609 | A1 | 10/2022 | Fick et al. | |
| 2022/0391688 | A1 | 12/2022 | Rasch | |
| 2023/0097217 | A1 | 3/2023 | Rasch et al. | |
| 2024/0037380 | A1* | 2/2024 | Henderson | G06N 3/09 |
| 2024/0160348 | A1* | 5/2024 | Le Gallo-Bourdeau | G06F 3/0679 |
| 2024/0241691 | A1 | 7/2024 | Shin et al. | |
| 2024/0419971 | A1* | 12/2024 | Büchel | G06N 3/084 |
| 2025/0209320 | A1* | 6/2025 | Simeone | G06N 3/047 |
| 2025/0253862 | A1* | 8/2025 | Büchel | G06N 3/09 |

FOREIGN PATENT DOCUMENTS

| | | | |
|---|---|---|---|
| WO | 2021/197562 | A1 | 10/2021 |
| WO | 2025/169017 | A1 | 8/2025 |

OTHER PUBLICATIONS

United States Patent And Trademark Office, Non-Final Office Action, Jul. 30, 2025, 12 pages, U.S. Appl. No. 18/433,782.

Banner et al., "Post Training 4-Bit Quantization of Convolutional Networks for Rapid-Deployment", 33rd International Conference on Neural Information Processing Systems (NeurIPS 2019), 2019, 9 pages.

Dong et al., "HAWQ: Hessian AWare Quantization of Neural Networks with Mixed-Precision", arXiv:1905.03696v1 [cs.CV], Apr. 29, 2019, 12 pages.

Fan et al., 'Training with Quantization Noise for Extreme Model Compression', arXiv:2004.07320v3 [cs.LG], Feb. 28, 2021, 20 pages.

Huang et al., "Automated Quantization Range Mapping for DAC/ADC Non-linearity in Computing-In-Memory", Proceedings—IEEE International Symposium on Circuits and Systems, May 2022, pp. 2998-3002.

Hubara et al., "Accurate Post Training Quantization With Small Calibration Sets", Proceedings of the 38th International Conference on Machine Learning, Jul. 18-24, 2021, pp. 4466-4475, vol. 139.

Jacob et al., "Quantization and Training of Neural Networks for Efficient Integer-Arithmetic-Only Inference", arXiv:1712.05877v1 [cs.LG], Dec. 15, 2017, pp. 2704-2713.

Kirtas et al., "Normalized Post-training Quantization for Photonic Neural Networks", IEEE Symposium Series on Computational Intelligence (SSCI), Dec. 4, 2022, pp. 657-663.

Krishnamoorthi et al., "Quantizing deep convolutional networks for efficient inference: A whitepaper", arXiv:1806.08342v1 [cs.LG], Jun. 21, 2018, 36 pages.

Lammie et al., "Improving the Accuracy of Analog-Based In-Memory Computing Accelerators Post-Training", arXiv, Jan. 18, 2024, 5 pages, https://arxiv.org/abs/2401.09859.

Laubeuf et al., "Dynamic Quantization Range Control for Analog-in-Memory Neural Networks Acceleration", ACM Transactions on Design Automation of Electronic Systems, 21 pages, vol. 27, Issue 5, Article No. 46.

Le Gallo et al., "Using the IBM Analog In-Memory Hardware Acceleration Kit for Neural Network Training and Inference", arXiv:2307.09357v1 [cs.ET], Jul. 18, 2023, 61 pages.

Lee et al., "Quantune: Post-training quantization of convolutional neural networks using extreme gradient boosting for fast deployment", arXiv:2202.05048v2 [cs.LG], Feb. 21, 2022, 13 pages.

Li et al., 'BRECQ: Pushing the Limit of Post-Training Quantization by Block Reconstruction', arXiv:2102.05426v2 [ cs.LG], Jul. 25, 2021, 16 pages.

Nagel et al., "Up or down? Adaptive Rounding for Post-Training Quantization", Proceedings of the 37th International Conference on Machine Learning, 2020, arXiv:2004.10568v2 [cs.LG], Jun. 30, 2020, 12 pages.

Nahshan et al., 'Loss aware post-training quantization', arXiv:1911.07190v2 [cs.LG], Mar. 16, 2020, 20 pages.

Park et al., 'Value-Aware Quantization for Training and Inference of Neural Networks', Computer Vision—ECCV 2018, 2018, pp. 608-624.

Pending U.S. Appl. No. 18/333,966, filed Jun. 13, 2023, titled "Controlling Signal Strengths in Analog, In-Memory Compute Units Having Crossbar Array Structures", 40 pages.

Wang et al., "Towards Accurate Post-Training Network Quantization via Bit-Split and Stitching", Proceedings of the 37th International Conference on Machine Learning, 2020, 10 pages, PMLR 119.

Zhao et al., "Improving Neural Network Quantization without Retraining using Outlier Channel Splitting", arXiv:1901.09504v3 [cs.LG], May 22, 2019, 10 pages.

R. Khaddam-Aljameh et al., "HERMES-Core—A 1.59-TOPS/mm2 PCM on 14-nm CMOS In-Memory Compute Core Using 300-ps/LSB Linearized CCO-Based ADCs," in IEEE Journal of Solid-State Circuits, vol. 57, No. 4, pp. 1027-1038, Apr. 2022, doi: 10.1109/JSSC.2022.3140414. 12 pages.

Choukroun et al., "Low-bit Quantization of Neural Networks for Efficient Inference", arxiv.org, Cornell University Library, 201 Olin Library Cornell University Ithaca, NY 14853, Feb. 18, 2019, 10 pages, XP081030569.

International Searching Authority, "Notification of Transmittal of the International Search Report and the Written Opinion of the International Searching Authority, or Declaration," Patent Cooperation Treaty Apr. 14, 2025, 14 pages, International Application No. PCT/ IB2025/050120.

Mehonic et al, "Simulation of Inference Accuracy Using Realistic RRAM Devices," Frontiers in Neuroscience, vol. 13, Jun. 2019. 15 pages. doi.org/10.3389/fnins.2019.00593.

Li et al, "Seizure Detection and Prediction by Parallel Memristive Convolutional Neural Networks," IEEE Transactions on Biomedical Circuits and Systems, vol. 16, No. 4, pp. 609-625, Aug. 2022. 17 pages. doi.org/10.1109/tbcas.2022.3185584.

Mackin et al,"Optimised weight programming for analogue memory-based deep neural networks," Nature Communications, vol. 13, No. 1, Jun. 2022. 12 pages. doi.org/10.1038/s41467-022-31405-1.

Pedretti et al, "Conductance variations and their impact on the precision of in-memory computing with resistive switching memory (RRAM)", 2021 IEEE International Reliability Physics Symposium (IRPS) | 978-1-7281-6893-7/21/$31.00 © 2021 IEEE | DOI: 10.1109/IRPS46558.2021.9405130. 8 pages, https://www.researchgate.net/https://ieeexplore.ieee.org/document/9405130; date Mar. 2021.

Li et al, "Impact of analog memory device failure on in-memory computing inference accuracy", Submitted: Oct. 24, 2022 • Accepted: Jan. 13, 2023 • Published Online: Feb. 14, 2023, Cite as: APL Mach. Learn. 1, 016104 (2023) 9 pages. https://doi.org/10.1063/5.0131797.

Mannocci et al,"In-memory computing with emerging memory devices: Status and outlook",Submitted: Nov. 25, 2022 • Accepted: Jan. 24, 2023 • Published Online: Feb. 14, 2023. Cite as: APL Mach. Learn. 1, 010902 (2023) 26 pages, https://doi.org/10.1063/5.0136403.

Spoon et al, "Toward Software-Equivalent Accuracy on Transformer-Based Deep Neural Networks With Analog Memory Devices," Frontiers in Computational Neuroscience, vol. 15, p. 675741, Jul. 2021. 9 pages. doi.org/10.3389/fncom.2021.675741.

Rasch et al, "A Flexible and Fast PyTorch Toolkit for Simulating Training and Inference on Analog Crossbar Arrays," 2021 IEEE 3rd International Conference on Artificial Intelligence Circuits and Systems (AICAS), 2021. 11 pages. doi.org/10.1109/AICAS51828.2021.9458494.

Le Gallo et al, "Precision of bit slicing with in-memory computing based on analog phase-change memory crossbars," Neuromorphic

(56) References Cited

OTHER PUBLICATIONS

Computing and Engineering, vol. 2, No. 1, p. 014009, Feb. 2022. 15 pages. doi.org/10.1088/2634-4386/ac4fb7.
Azghadi et al, "Hardware Implementation of Deep Network Accelerators Towards Healthcare and Biomedical Applications," in IEEE Transactions on Biomedical Circuits and Systems, vol. 14, No. 6, pp. 1138-1159, Dec. 2020. 23 pages. doi.org/10.1109/TBCAS.2020.3036081.
Doevenspeck et al, "OxRRAM-Based Analog in-Memory Computing for Deep Neural Network Inference: A Conductance Variability Study", IEEE Transactions on Electron Devices, vol. 68, No. 5, May 2021. 5 pages. https://ieeexplore.ieee.org/abstract/document/9405305.
Qiwen Wang, Xinxin Wang, Seung Hwan Lee, Fan-Hsuan Meng, Wei D. Lu., "A Deep Neural Network Accelerator Based on Tiled RRAM Architecture," 2019 IEEE International Electron Devices Meeting (IEDM), Dec. 2019. 4 pages. doi.org/10.1109/iedm19573.2019.8993641.
Khaddam-Aljameh et al, "HERMES-Core—A 1.59-TOPS/mm2 PCM on 14-nm CMOS In-Memory Compute Core Using 300-ps/LSB Linearized CCO-Based ADCs," in IEEE Journal of Solid-State Circuits, vol. 57, No. 4, pp. 1027-1038, Apr. 2022. 12 pages. doi.org/10.1109/JSSC.2022.3140414.
He et al, "Noise Injection Adaption: End-to-End ReRAM Crossbar Non-ideal Effect Adaption for Neural Network Mapping," 2019 56th ACM/IEEE Design Automation Conference (DAC), 2019. 6 pages. doi.org/10.1145/3316781.3317870.
M. J Rasch et al., "Hardware-aware training for large-scale and diverse deep learning inference workloads using in-memory computing-based accelerators", tFeb. 17, 2023. 35 pages. https://doi.org/10.48550/arXiv.2302.08469.
Noise and Bound Management, 14 pages. https://aihwkit.readthedocs.io/en/latest/api/aihwkit.simulator.configs.enums.html#aihwkit.simulator.configs.enums.

* cited by examiner

300

CONDUCTANCE RANGE OPTIMIZATION

BACKGROUND

The present application relates generally to analog memory devices, and more particularly, to techniques that can optimize the conductance range of unit cells comprising of analog memory devices.

Analog memory devices can be utilized for in-memory computing. Compared to traditional computing hardware, in-memory computing hardware can increase speed and energy efficiency, providing potential performance improvements. Rather than moving data from memory devices to a processor to perform a computation, analog memory devices can perform computation in the same place (e.g., in the analog memory) where the data is stored. Because there is no movement of data, tasks can be performed faster and require less energy.

BRIEF SUMMARY

The summary of the disclosure is given to aid understanding of a system and method of optimizing conductance range of unit cells comprising of analog memory devices. Optimized conductance ranges of the analog memory devices can improve the accuracy of operations performed using them, which can provide improved efficiency, and not with an intent to limit the disclosure or the invention. It should be understood that various aspects and features of the disclosure may advantageously be used separately in some instances, or in combination with other aspects and features of the disclosure in other instances. Accordingly, variations and modifications may be made to the system and/or their method of operation to achieve different effects.

In one embodiment, a method for optimizing conductance ranges of a plurality of unit cells is generally described. The method can include defining a plurality of initial conductance ranges for a plurality of unit cells arranged in a crossbar arrangement. The plurality of unit cells can include non-volatile memory (NVM) devices. An initial conductance range can be defined per column of unit cells in the crossbar arrangement. The method can further include using the plurality of initial conductance ranges to encode a plurality of parameter values in a circuit model of the analog memory devices. The method can further include inputting a plurality of sample inputs into the circuit model to determine an output current distribution correlated to a plurality of products between the plurality of sample inputs and the plurality of parameter values. The method can further include determining, based on at least one property of the output current distribution, an optimal conductance range for the plurality of unit cells.

In one embodiment, a system for optimizing conductance ranges of a plurality of unit cells is generally described. The system can include memory configured to store a plurality of parameters. The system can further include a processor configured to define a plurality of initial conductance ranges for a plurality of unit cells arranged in a crossbar arrangement. The plurality of unit cells can include non-volatile memory (NVM) devices. An initial conductance range can be defined per column of unit cells in the crossbar arrangement. The processor can be further configured to use the plurality of initial conductance ranges to encode the plurality of parameter values in a circuit model of the analog memory device. The processor can be further configured to input a plurality of sample inputs into the circuit model to determine an output current distribution correlated to a plurality of products between the plurality of sample inputs and the plurality of parameter values. The processor can be further configured to determine, based on at least one property of the output current distribution, an optimal conductance range for the plurality of unit cells.

In one embodiment, a computer readable storage medium storing a program of instructions executable by a machine to perform one or more methods described herein also may be provided.

Further features, as well as the structure and operation of various embodiments, are described in detail below with reference to the accompanying drawings. In the drawings, like reference numbers indicate identical or functionally similar elements.

DETAILED DESCRIPTION

Figure 1:
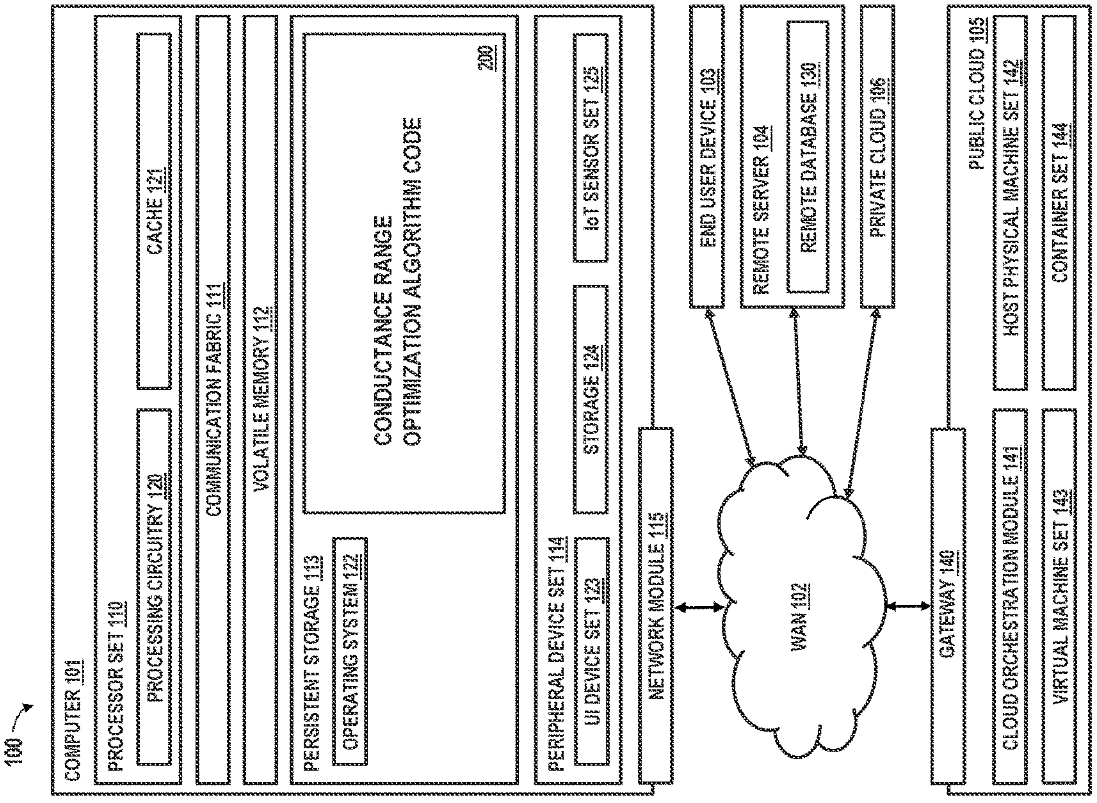
FIG. 1 illustrates an example computer or processing system or environment that may implement a system for conductance range optimization in one embodiment.

According to an aspect of the invention, there is provided a method for conductance range optimization. A method for optimizing conductance ranges of a plurality of unit cells is generally described. The method can include defining a plurality of initial conductance ranges for a plurality of unit cells arranged in a crossbar arrangement. The plurality of unit cells can include non-volatile memory (NVM) devices. An initial conductance range can be defined per column of unit cells in the crossbar arrangement. The method can further include using the plurality of initial conductance ranges to encode a plurality of parameter values in a circuit model of the analog memory device. The method can further include inputting a plurality of sample inputs into the circuit model to determine an output current distribution correlated to a plurality of products between the plurality of sample inputs and the plurality of parameter values. The method can further include determining, based on at least one property of the output current distribution, an optimal conductance range for the plurality of unit cells.

Advantageously, the method in an aspect can optimize conductance range of conductive devices in a plurality of unit cells of an analog memory device. The optimized conductance range can constrain the output current of the analog memory device in a linear region, thus reducing error and improving accuracy of the output.

One or more of the following aspects or features can be separable or optional from each other in one or more embodiments.

In another aspect, the plurality of parameter values can represent parameters of a trained machine learning model. The method can further include selecting an input distribution that best fits a training set of the trained machine learning model. The method can further include selecting the plurality of sample inputs from the input distribution. The selection of the input distribution and sampling from the selected input distribution can reduce the number of input samples being used in the conductance range optimization. Also, performing the conductance range optimization after training of the machine learning model prevents interference with the training of the machine learning model.

Yet in another aspect, the method can further include selecting the plurality of sample inputs by applying a kernel density estimation technique on the training set. The application of kernel density estimation can sample a subset of the input dataset, such that the required information about the input dataset, can be reduced.

Yet in another aspect, the method can further include selecting the plurality of sample inputs by selecting at least one of a subset of a training set used in training the trained machine learning model, a validation set used in an accuracy evaluation during training of the trained machine learning model and a test set used in performance evaluation of the trained machine learning model. The selection of the sample inputs can provide flexibility in the types of sample inputs that can be used, and provides sample inputs that may be readily available, for performing conductance range optimization.

Yet in another aspect, the method can further include determining the output current distribution by measuring an output current of every column of unit cells sequentially. The output current measurement from every column of unit cells sequentially allows optimization of conductance ranges for individual columns of unit cells.

Yet in another aspect, the method can further include defining an objective corresponding to the output current distribution and an analog-to-digital converter (ADC) connected to outputs of the plurality of unit cells. The method can further include comparing the at least one property of the output current distribution with different current region boundaries of the ADC to obtain a difference. The method can further include updating the optimal conductance range until the difference satisfies the objective. Using an objective to optimize the conductance range can provide a stopping criterion to complete conductance range optimization, without overloading the system performing the conductance range optimization.

Yet in another aspect, the method can further include initializing a value of a maximum current. The method can further include adjusting the maximum current based on a difference between an output current of a column of unit cells and the maximum current. The method can further include comparing the adjusted maximum current with a saturation current of an ADC connected to outputs of the plurality of unit cells to obtain a difference. The method can further include determining the optimal conductance range of the column of unit cells based on the difference. Using the comparison between the maximum current and the saturation current can allow a system to perform conductance range optimization when optimization algorithms are not readily available.

Yet in another aspect, the method can further include determining a respective optimal conductance range for each column of unit cells. The method can further include determining a respective optimal conductance range for different groups of columns of unit cells. The method can further include determining an optimal conductance range for an entirety of the plurality of unit cells. Optimizing conductance ranges for different groups of columns of unit cell can provide flexibility on the granularity of conductance range tuning.

Yet in another aspect, the method can further include determining a product among a sum of conductance values of a subset of the plurality of unit cells that received a non-zero input among the plurality of input samples, a read voltage being used for reading output current from the plurality of unit cells, and a linear correlation coefficient. The method can further include approximating the output current distribution using the product. Approximating the output current distribution based on the linear correlation coefficient can allow a system to consider a relationship between hardware components (e.g., analog-to-digital converters) and the conductance of the unit cells.

A system that includes at least one processor and at least one memory device can be provided, where at least one processor can be configured to perform one or more aspects of the methods described herein.

A computer program product that includes a computer readable storage medium having program instructions embodied therewith, the program instructions readable by a device to cause the device to perform at least one or more aspect of the methods described above can be provided.

An example technical use case of the methods, systems, and computer program products described herein include machine learning applications. Hardware such as analog memory devices can be used to run machine learning models. The conductance range of conductive devices in the unit cells of the analog memory device can be tuned to optimize values in order to improve the accuracy of machine learning models. Further, the conductance range optimization is performed after training of the machine learning model and prior to the hardware being programmed to run the trained machine learning model.

A crossbar (or analog in-memory core (AIMC)) can include a plurality of unit cells including one or more conductive devices. These conductive devices, when arranged in a crossbar arrangement, can be used to perform multiply-accumulate (MAC) and vector-matrix multiplication (VMM) operations in as little as order O(1) time complexity. This can be accomplished by encoding inputs as either analog voltages or pulse width modulation (PWM) pulses, and encoding parameters (e.g., weights) using the conductance state of devices. Using Ohm's law, current I is a product of voltage V and conductance G (e.g., I=V×G). The current summed in each crossbar column represents one element of the resulting multiplication vector of size N. Analog memory devices can be used in various applications, such as machine learning model training and inference. Parameters of machine learning models, such as weights, can be mapped between a high or maximum conductive (Gmax) state, and a low or minimum conductive (Gmin) state of the conductive devices.

FIG. 1 illustrates an example computer or processing system or environment that may implement a system for conductance range optimization in one embodiment. As shown in FIG. 1, computing environment 100 can include an example of an environment for the execution of at least some of the computer code involved in performing the inventive methods described herein, such as a conductance range optimization algorithm code 200. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI), device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101) and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
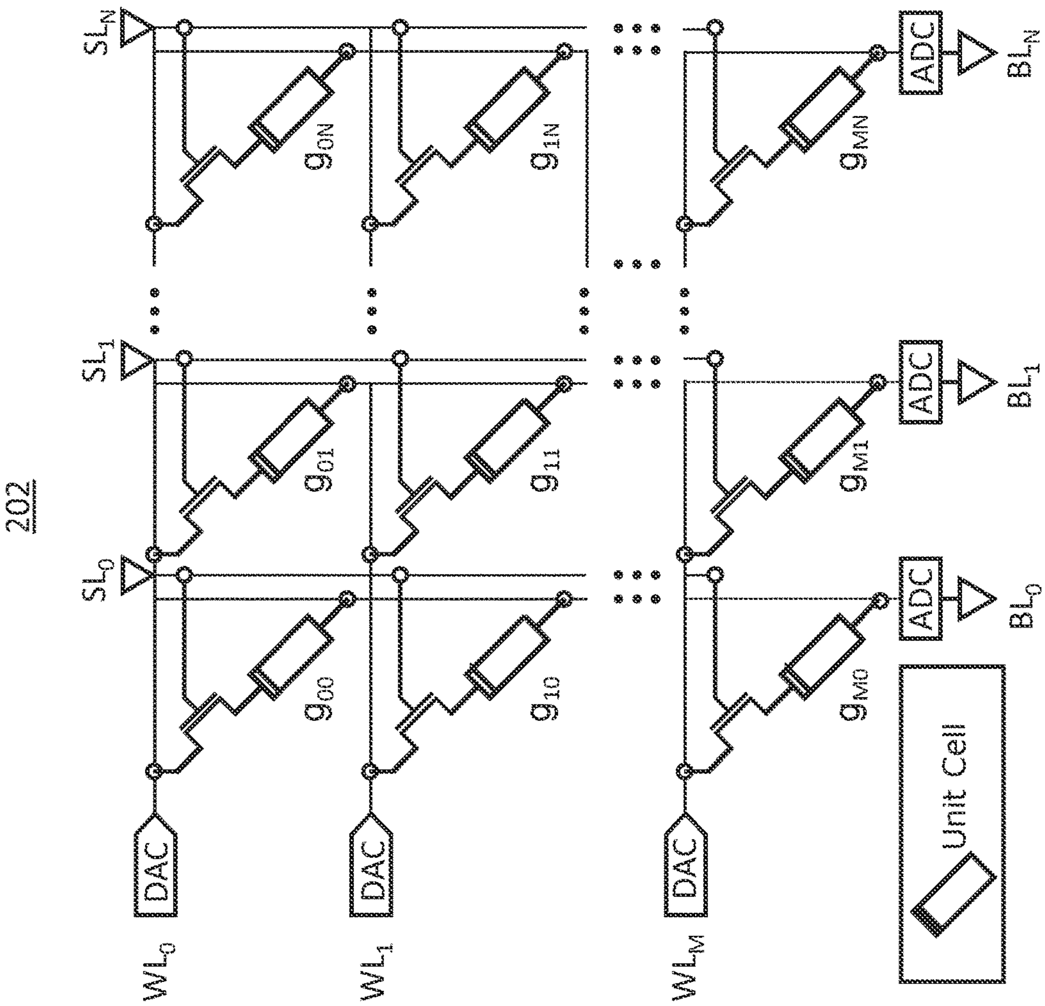
FIG. 2 is a diagram illustrating a plurality of unit cells arranged in a crossbar arrangement in one embodiment.

FIG. 2 is a diagram illustrating an example AIMC, in one embodiment. An AIMC 202 can communicate with one or more digital processors to facilitate operations or functions of AIMCs 202. Peripheral circuitry such as a plurality of DACs and ADCs in FIG. 2 can interface with the crossbar in the AIMC 202. The DACs can be used for encoding inputs as voltages, and the ADCs can be used for converting output analog signals resulting from computations performed using the crossbar or AIMC 202 into digital signals.

Unit cells, including one or more conductive devices with conductance $g_{0,0}, \ldots, g_{(M-1),(N-1)}$, can be arranged in a crossbar array having M−1 rows of word lines $WL_0, \ldots, WL_{M-1}$ and N−1 columns of bit lines $BL_0, \ldots, BL_{N-1}$. The unit cells can be arranged at cross points of the crossbar array. The unit cells in analog memory device 202 can be, for example, resistive RAM (ReRAM), conductive-bridging RAM (CBRAM), NOR flash, magnetic RAM (MRAM), and phase-change memory (PCM). In machine learning applications, the unit cells can be programmed to store and encode synaptic weights values and biases of an artificial neural network (ANN).

The conductance values $g_{00}, \ldots, g_{MN}$ can encode or map a plurality of weights and biases, represented as a matrix W, of a trained machine learning model (e.g., a trained neural network). In an aspect, a conductance $g_{ij}$ can be expressed as $$g_{ij} = w_{ij}\left(\frac{Gmax}{Wmax}\right),$$

where $g_{ij}$ denotes a mapped conductance value of a conductive device at an i-th row and j-th column, $w_{ij}$ denotes the parameter or weight value to be mapped to the conductive device at an i-th row and j-th column, Gmax denotes a maximum conductance value defined for the crossbar array and Wmax is the maximum parameter value to be mapped. A conductance range for encoding the parameters $w_{ij}$ can be defined as the range of values of $g_{ij}$ between the high conductive state Gmax and the low conductive state Gmin. The value of Gmin can be zero or a predefined value that can be relatively small.

In an aspect, hardware limitations and various device or circuit nonidealities of the peripheral circuitry can present challenges to mapping of weights to conductance states. In an aspect, ADCs can have non-linear and saturation regions, which are undesirable in the context of analog memory devices. If output currents of the analog memory device reside in the non-linear and saturation regions, significant errors can be introduced. In order to constrain output currents in the linear operation region, the conductance region of conductive devices in the unit cells being used for mapping parameters can be optimized.

One conventional technique to constrain output current in the linear operating region is bit slicing, but bit slicing tends to increase latency. Another conventional technique can aim to maximize the signal to noise ratio (SNR) in AIMCs without allowing peripheral circuitry to enter non-linear regions by tuning the conductance range for each column. Other conventional techniques, such as hardware-aware retraining (HWAR) techniques, can also be used for tuning conductance ranges. HWAR is a machine learning technique that uses characteristics and limitations of the target hardware on which a trained machine learning model will be deployed. In an aspect, HWAR techniques such as quantization-aware training (QAT) and noise injection or regularization, may be used for optimizing conductance ranges during retraining of the machine learning model. However, tuning and optimizing conductance ranges during training or learning increases the complexity, and thus decreases the performance of HWAR.

To be described in more detail below, the systems and methods described herein can optimize conductance ranges for each column, or different groups of columns, in an analog memory device post HWAR. The systems and methods described herein can utilize various known information, such as portions of dataset being used for training and evaluating a trained machine learning model and properties of the target hardware being used for mapping parameters of the trained machine learning model, to optimize conductance range of conductive devices in the target hardware. Further, a circuit model that simulates the target hardware can be used in the optimization without a need to reprogram the target hardware during optimization.

Figure 3:
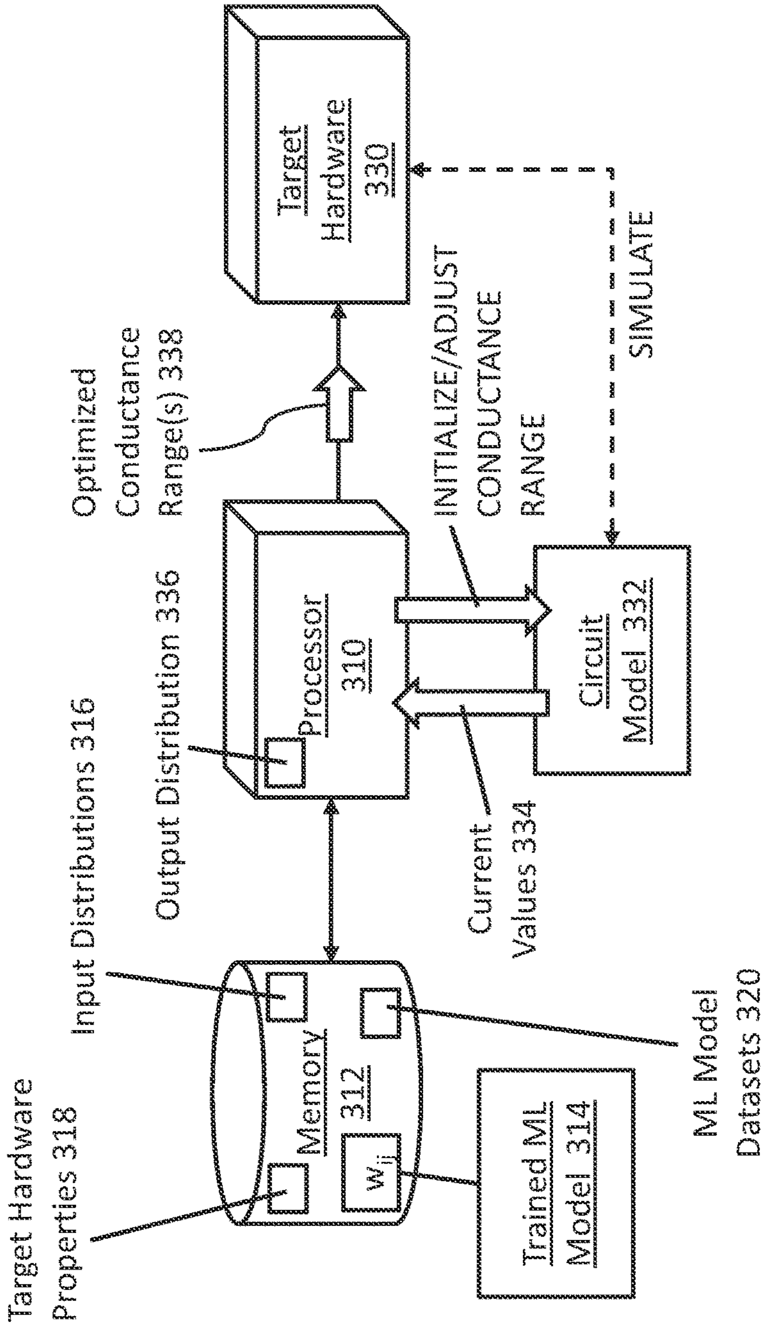
FIG. 3 is a diagram illustrating an example system that can implement conductance range optimization in one embodiment.

FIG. 3 is a diagram illustrating an example system 300 that can implement conductance range optimization in one embodiment. System 300 shown in FIG. 3 can be a computing system including at least a processor 310 and a memory 312. Processor 310 can be composed of at least one of microprocessors, microcontrollers, central processing units (CPU), single core processors, multi-core processors, other types of processors, and/or computing hardware composed of analog and/or digital circuitry. Memory 312 can be composed of at least one of volatile memory (e.g., random access memory (RAM) including static RAM and dynamic RAM, and/or other volatile memory (e.g., read only memory (ROM), erasable programmable ROM, and electrically erasable programmable ROM, and/or other non-volatile memory). Memory 312 can be configured to store data in digital form, and can be configured to store instructions as various forms of program code. Processor 310 can be configured to access and run program codes stored in memory 312 to perform various computer operations.

In one embodiment, memory 312 can be configured to store program code such as source code and/or executable code that can be accessed by processor 310 to run various applications and programs. By way of example, processor 310 can access program code stored in memory 312 to run a circuit modeling application that generates one or more circuit models simulating operations of hardware devices, such as analog memory devices. Processor 310 can also access various types of data being stored in memory 312.

In one embodiment, memory 312 can store parameters, such as weights $w_{ij}$ and biases, of a trained machine learning (ML) model 314. The trained ML model 314 parameters are to be programmed and/or encoded in a target hardware 330. Once the parameters of trained ML model 314 are programmed and/or encoded in target hardware 330, target hardware 330 can be deployed to perform inference. Target hardware 330 can be an analog memory device, including a plurality of unit cells arranged in a crossbar arrangement. Each one of the plurality of unit cells can include non-volatile memory (NVM) devices implemented by conductive devices. In one embodiment, target hardware 330 can be an AIMC 202, as shown in FIG. 2.

In one embodiment, prior to programming target hardware 330 with parameters of a trained ML model 314, the processor 310 can be configured to optimize conductance ranges of conductive devices in the unit cells of the target hardware 330. The conductance range optimization can begin with a processor 310 determining and/or approximating properties that may be required for target hardware 330 to generate output currents representing results of MAC operations, VMM operations, or other operations that can be performed by the target hardware 330. The parameters and properties that can be determined by processor 310 may include known information such as target hardware properties 318. Target hardware properties 318 can include at least one of, a number and composition of unit cells in target hardware 330, the physical conductance range of each unit cell in target hardware 330, input voltage range, transfer functions of the ADCs in the target hardware 330, weight and output noise model parameters, parameters relating to sources of non-linear errors (e.g., line resistances), process variation constants for circuit elements in target hardware 330, a number of inputs per read cycle used to determine output current distribution(s) of target hardware 330, and other properties of the target hardware 330. In one embodiment, the known information being determined by processor 310 can be dependent on an approach being used by target hardware 330 to compute and/or approximate output currents.

Processor 310 can set or define a plurality of initial conductance ranges for the unit cells of the target hardware 330. In one embodiment, to define the initial conductance ranges, processor 310 can set Gmin to be zero for all columns of unit cells, and set different values of Gmax for different columns of unit cells, or different groups of columns of unit cells. In one embodiment, in order to maximize signal to noise ratio (SNR), Gmax can be initially set to a maximum conductance value obtainable by all unit cells in the target hardware 330.

In one example, a first initial value of Gmax1 can be defined for the unit cells in column N=0 in FIG. 2 such that the initial conductance range for column N=0 ranges from Gmin to Gmax1, and a second initial value of Gmax2 can be defined for the unit cells in column N=1 in FIG. 2 such that the initial conductance range for column N=1 ranges from Gmin to Gmax2. In another example, a first initial value of Gmax1 can be defined for the unit cells in columns N=0, N=1, N=2 in FIG. 2 such that the initial conductance range for columns N=0, N=1, N=2 ranges from Gmin to Gmax1, and a second initial value of Gmax2 can be defined for the unit cells in column N=3, N=4 in FIG. 2 such that the initial conductance range for column N=3, N=4 ranges from Gmin to Gmax2.

Processor 310 can obtain (e.g., retrieve from memory 312) parameters, $w_{ij}$, of the trained ML model 314. Processor 310 can use target hardware properties 318, the initial conductance ranges, and parameters $w_{ij}$ to program a circuit model 332 in one embodiment. The circuit model 332 can be a virtual model or representation of the target hardware 330 that simulates operations, parameters, and properties of target hardware 330. Circuit model 332 can compute or estimate the output current distributions of the ADCs given the input word-line voltages. In one embodiment, circuit model 332 can be realized using a behavioral-based or physics-based model, such as a SPICE model (e.g., a text-description of an AIMC that can be used by a SPICE Simulator to mathematically predict the behavior of the AIMC under varying conditions). Processor 310 can also be configured to adjust these simulated parameters and properties of circuit model 332. In an embodiment, processor 310 can program circuit model 332 to have specifications in virtual space that may be identical or substantially identical to specifications of target hardware 330 in physical space. By way of example, programming circuit model 332 using the initial conductance ranges to encode weights $w_{ij}$ in circuit model 332 can allow processor 310 to simulate operations of target hardware 330 where the same initial conductance ranges are used for encoding weights $w_{ij}$.

In order to run the circuit model 332, the processor 310 can provide inputs to the circuit model 332 in order for the circuit model 332 to perform operations, such as MAC or VMM operations, to generate an output distribution 334. By way of example, the target hardware 330 can be an AIMC 202, shown in FIG. 2, and the circuit model 332 can simulate the AIMC 202. Processor 310 can determine inputs to be applied on the word lines $WL_0, \ldots, WL_M$, and feed the determined inputs to circuit model 332. Processor 310 can be configured to determine the input to be provided to circuit model 332. Memory 312 can store a ML model dataset 320 that includes at least a training set used in training of trained ML model 314, a validation set used in an accuracy evaluation during training of trained ML model 314, or a test set used in a performance evaluation (post training) of the trained ML model 314.

In one embodiment, processor 310 can determine the input to be provided to circuit model 332 by sampling subsets of at least one of either the training set, the validation set, or the test set. For example, processor 310 may sample subsets from the training set. As another example, processor 310 may sample subsets form the validation set. As yet another example, processor 310 may sample subsets from the test set. Yet as another example, processor 310 may sample subsets from two or more of those sets, e.g., two or more combinations of the training set, the validation set and the test set. In another embodiment, processor 310 can select a specific distribution (e.g., statistical distribution) from a plurality of candidate distributions, such as input distributions 316 stored in memory 314. The selected distribution can be a distribution that best fits the training set that was used for training of trained ML model 314. Processor 310 can input the selected distribution as an input to circuit model 332. In another embodiment, processor 310 can perform kernel density estimation (KDE) on the training set to generate a distribution and input the distribution to circuit model 332. In one embodiment, KDE can be performed on data that is representative of what the trained ML model 314 may receive after pre-processing is performed Processor 310 can run the circuit model 332 with the determined inputs, and the circuit model 332 can output current values 334 that simulate currents being outputted from bit lines $BL_0, \ldots, BL_N$ of the AIMC 202. Processor 310 can determine an output distribution 336, that is a statistical distribution of current values 334. In one embodiment where the ADCs in target hardware 330 are current-controlled oscillators (CCO)-based ADCs, memory 312 can store a value of a linear correlation coefficient γ that defines a relationship between an ADC count (e.g., the value of the ADC counter) in target hardware 330 and the corresponding current. Processor 310 can determine, for one or more columns of unit cells, a sum G of conductance values programmed in circuit model 332. The sum G can be multiplied with the coefficient γ and voltages V that was used for encoding inputs being provided to the rows of unit cells intersecting the one or more columns of unit cell. Processor 310 can determine the current output of the column of unit cells by multiplying the product with a read voltage being used for reading the output current from the one or more columns of unit cells. By way of example, for unit cells in a j-th column, the output current $I_j = V_{read} \times G_j V[V!=0]\gamma$, where $V_{read}$ is the voltage being used for reading output current from the unit cells. Note, that in the output current determination, the values of V being used in the determination are nonzero values of V.

Processor 310 can analyze the output distribution 336 to determine optimized conductance range(s) 338. By way of example, processor 310 can determine at least one property of output distribution 336, such as the mean, median, mode, standard deviation, entropy, skew, minimum and maximum values, an k-th quartile, or other properties. Processor 310 can update the conductance values in circuit model 332 based on the determined properties of output distribution 336.

In one embodiment, the processor 310 can perform optimization techniques, such as Bayesian optimization, to adjust the conductance values in circuit model 332 until optimized conductance ranges 338 are determined for each column, or different groups of columns, or unit cells in target hardware 330. Processor 310 can define objectives, such as objectives to minimize or maximize differences between output distribution 336 and a saturation current threshold (e.g., current in which the ADC enters non-linear or saturation regimes). In one embodiment, the objective defined by processor 310 can be to minimize a difference between the saturation current threshold of the ADCs and a k-th quartile of output distribution 336. Processor 310 can adjust conductance ranges of circuit model 332, or adjust Gmax, to cause circuit model 332 to generate updated current values 334. Processor 310 can update output distribution 336 with the updated current values 334 and determine whether the updated output distribution 336 satisfies the defined objective. Processor 310 can repeat the adjustment to the conductance values and update the output distribution 336 until a stopping criterion, such as when output distribution 336 satisfies the defined objective. The conductance values in circuit model 332 that causes the output distribution 336 to satisfy the defined objective can be set by processor 310 as optimized conductance ranges 338. In one embodiment, the stopping criterion can also be an upper bound, on a maximum number of iterations or adjustments made to the conductance value in circuit model 332.

In another embodiment, processor 310 can compare output distributions 336 with the saturation current threshold of the ADCs. The comparison can show which columns in circuit model 332 output current greater than or less than the saturation current threshold. Processor 310 can, for example, decrease Gmax for columns where the output current is greater than the saturation current threshold, to reduce the conductance range. Processor 310 can also increase Gmax for columns where the output current is less than the saturation current threshold, to increase the conductance range. Processor 310 can continue to increase or decrease Gmax for different columns, until a specific criteria or objective is satisfied. For example, a criterion may be to have X % of the columns outputting current below the saturation current threshold. Processor 310 can adjust Gmax until output distribution 336 shows X % of the columns output current below the saturation current threshold. The conductance values in circuit model 332 that causes X % of the columns output current below the saturation current threshold can be set by processor 310 as optimized conductance ranges 338.

In response to determining optimized conductance ranges 338, conductive devices in unit cells of target hardware 330 can be tuned to the optimized conductance ranges 338. In one embodiment, each column of unit cells in target hardware 330 can be tuned to an individual conductance range. In another embodiment, different regions or groups of columns of unit cells in target hardware 330 can be tuned to an individual conductance range. In another embodiment, all columns of unit cells in target hardware 330 can be tuned to a single conductance range. In response to target hardware 330 being tuned with optimized conductance ranges 338, parameters of trained ML model 314, such as weights $w_{ij}$ or bias, can be encoded in the unit cells of target hardware 330. Target hardware 330 with encoded parameters of trained ML model 314 can be deployed to various applications for performing inference on new input data.

Figure 4:
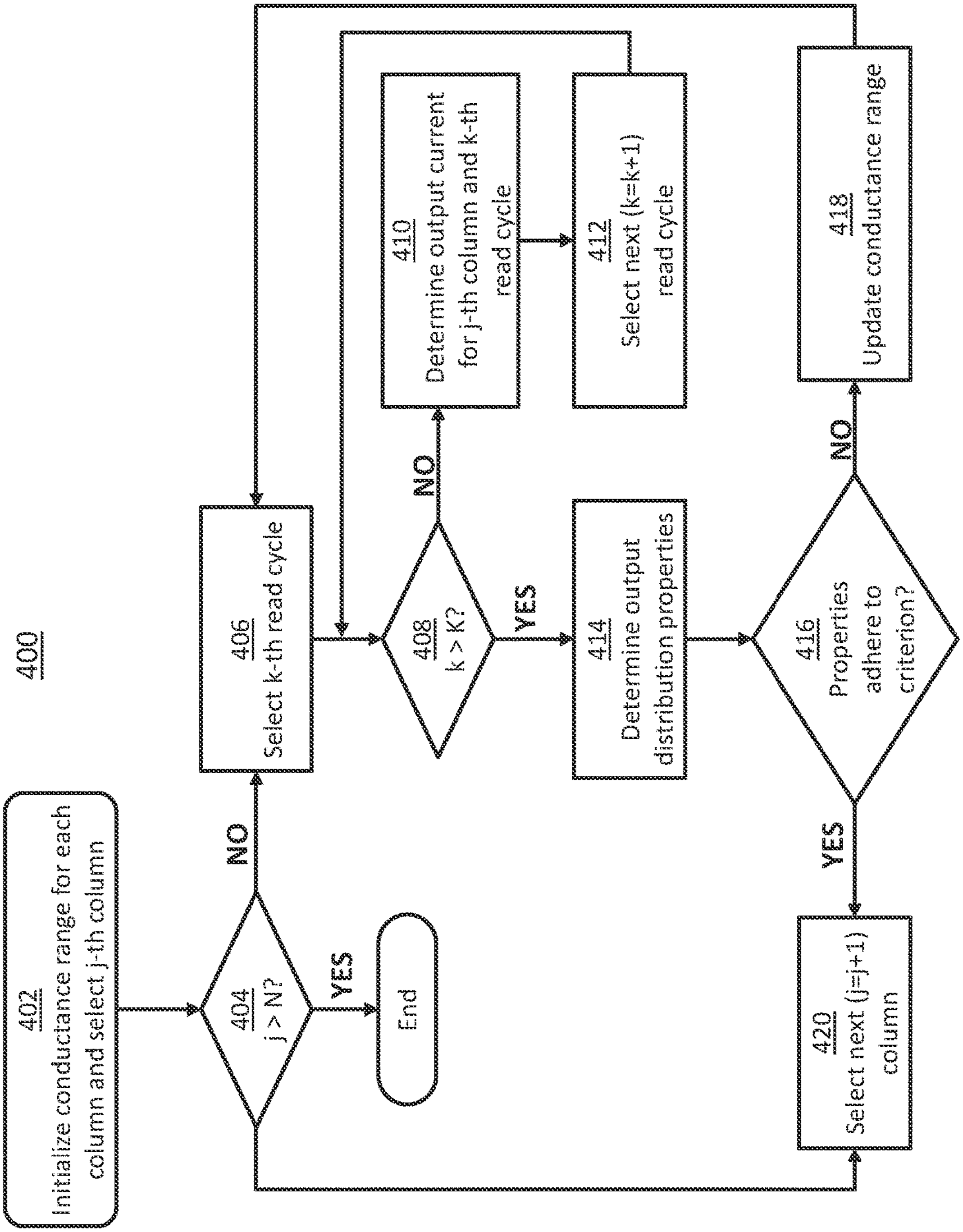
FIG. 4 is a diagram illustrating a process that performs conductance range optimization in one embodiment.

FIG. 4 is a diagram illustrating a process 400 that performs conductance range optimization in one embodiment. Process 400 can be performed by system 300 shown in FIG. 3. In one embodiment, process 400 can be performed to optimize each individual column of unit cells sequentially. In another embodiment, multiple instances of process 400 can be performed for different columns in parallel. In another embodiment, process 400 can be performed on groups of columns. Process 400 can begin at a block 402. At block 402, a processor (e.g., processor 310) can initialize conductance range for each column of unit cells in an analog memory device, and select a j-th column of unit cells. Different conductance ranges can be initialized for each individual column of unit cells, or for groups or regions of columns of unit cells, or one conductance range can be defined for all columns of unit cells.

Process 400 can proceed from block 402 to block 404. At block 404, the processor can determine whether the selected j-th column (e.g., starting from j=0) of unit cells exceeds the last column (e.g., (N−1)-th column) of unit cells in the analog memory device. In response to the j-th column of unit cells exceeding the last column (e.g., j>N−1), the processor can determine that all columns have been processed and proceeds to end process 400. In response to the j-th column of unit cells preceding, or being equal to, the last column (e.g., j≤N−1), the process can proceed to block 406.

At block 406, the processor can select a k-th read cycle (e.g., starting from k=1). Depending on the unit cell configuration and ADC type in the analog memory device, outputs are read using one or more current read cycles. An example of a scenario where multiple read cycles are required, would be if an ADC could only read positive currents.

Process 400 can proceed from block 406 to block 408. At block 408, the processor can determine whether the selected k-th read cycle exceeded the last read cycle K (e.g., k>K). In response to k≤K, process 400 can proceed to block 410. At block 410, the processor can determine output distribution for the j-th column and k-th read cycle. If j>0 and k>1, the processor can update an existing output distribution.

Process 410 can proceed from block 410 to block 412. At block 412, the processor can select a next read cycle and process 400 can return to block 408. The processor can continue to determine and/or update the output distribution at block 410 until a last read cycle K is performed. Note that the output distribution being determined and/updated at block 410 is an output distribution of currents being outputted from the j-th column.

At block 408, in response to k>K, process 400 can proceed to block 414. At block 414, the processor can determine one or more properties of the output distribution determined at block 410. Process 400 can proceed from block 414 to block 416. At block 416, the processor can determine whether the properties determined at block 414 adhere to predefined criterions (the criterions as described above). In response to the properties determined at block 414 not adhering to the predefined criterions, process 400 can proceed to block 418.

At block 418, the processor can update the conductance range that was initialized for the j-th column at block 402. Process 400 can return from block 418 to block 406, where the processor can select the k-th current read cycle starting from k=1. The processor can continue to perform one or more of blocks 408, 410, 412, 414, 416, 418 until the properties determined at block 414 adhere to predefined criterions at block 416. Note that the updated conductance range in block 418 that caused the properties to adhere to the predefined criterions can be set as optimized conductance range for the j-th column. In response to the properties determined at block 414 adhering to predefined criterions at block 416, process 400 can proceed to block 420. At block 420, the processor can select a next column of unit cells and return to block 404.

Figure 5:
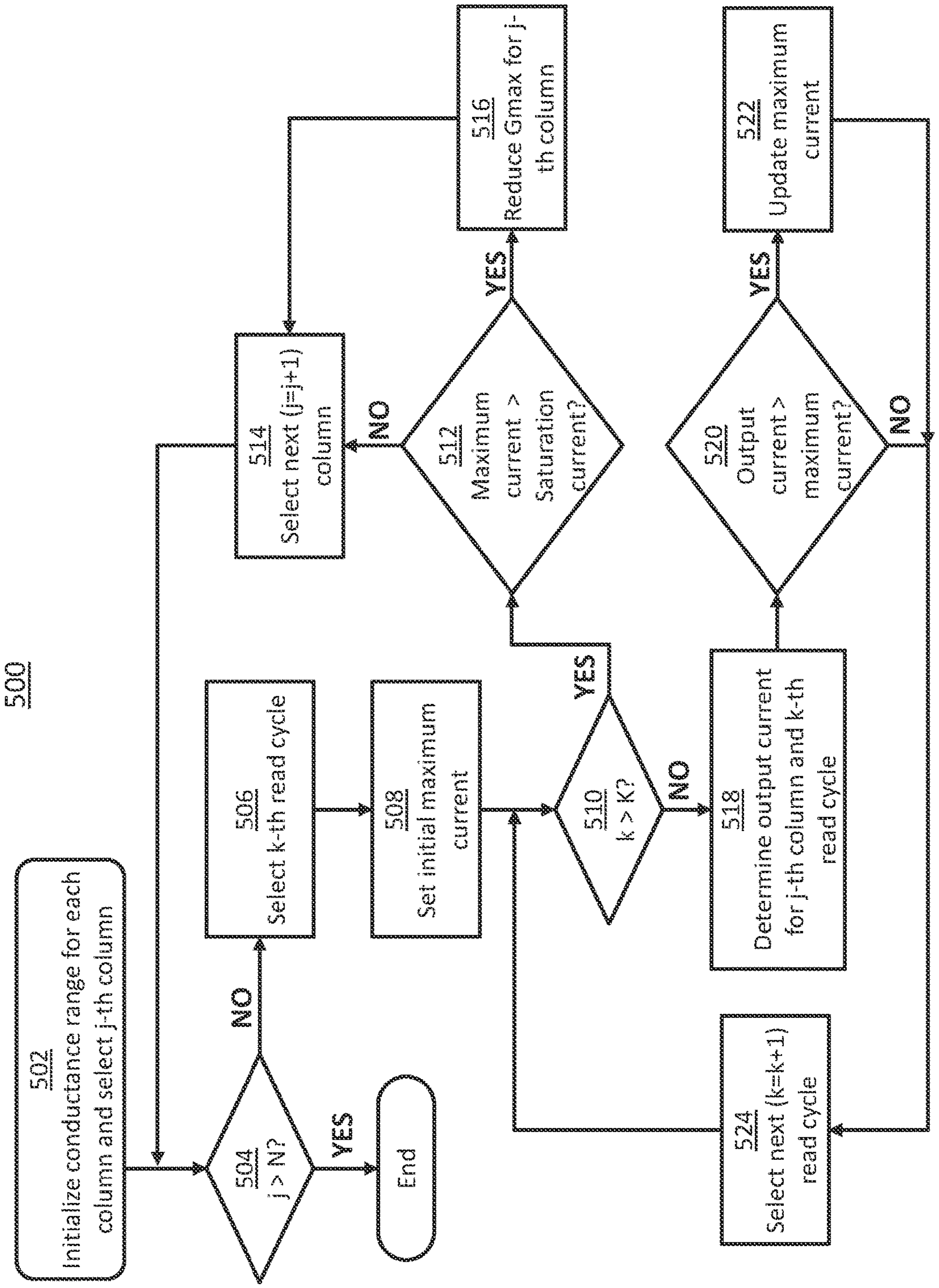
FIG. 5 is a diagram illustrating another process that performs conductance range optimization in one embodiment.

FIG. 5 is a diagram illustrating another process 500 that performs conductance range optimization in one embodiment. Process 500 can be performed by system 300 shown in FIG. 3. In one embodiment, process 500 can be performed to optimize each individual column of unit cells sequentially. In another embodiment, process 500 can be performed on groups of columns. Process 500 can be an iterative-based approach to determine optimized conductance ranges for unit cells in an analog memory device.

Process 500 can begin at a block 502. At block 502, a processor (e.g., processor 310) can initialize conductance range for each column of unit cells in an analog memory device. and select a j-th column of unit cells. Different conductance ranges can be initialized for each individual column of unit cells, or for groups or regions of columns of unit cells, or one conductance range can be defined for all columns of unit cells.

Process 500 can proceed from block 502 to block 504. At block 504, the processor can determine whether the selected j-th column (e.g., starting from j=0) of unit cells exceeds the last column (e.g., (N−1)-th column) of unit cells in the analog memory device. In response to the j-th column of unit cells exceeding the last column (e.g., j>N−1), the processor can determine that all columns have been processed and proceeds to end process 500. In response to the j-th column of unit cells preceding, or being equal to, the last column (e.g., j≤N−1), the process can proceed to bock 506.

At block 506, the processor can select a k-th read cycle (e.g., starting from k=1). Depending on the unit cell configuration and ADC type in the analog memory device, outputs are read using one or more current read cycles. An example of a scenario where multiple read cycles are required would be if an ADC could only read positive currents. Process 500 can proceed from block 506 to block 508. At block 508, the processor can set an initial maximum current for the j-th column based on the saturation current of one or more ADCs in target hardware 330 (see FIG. 3). In one embodiment, the initial maximum current can be set to be equal to the saturation current of the ADC of the j-th column. In another embodiment, the initial maximum current can be set as a percentage of the saturation current of the ADC of the j-th column. In an aspect, each ADC in target hardware 330 can have a different saturation current. Hence, in another embodiment, the average saturation current for all ADCs in the target hardware 330 can be used as the initial maximum current value for all columns.

Process 500 can proceed from block 508 to block 510. At block 510, the processor can determine whether the selected k-th read cycle exceeded the last read cycle K (e.g., k>K). In response to k≤K, process 500 can proceed to block 518. At block 518, the processor can determine output distribution for the j-th column and k-th read cycle. If j>0 and k>1, the processor can update an existing output distribution.

Process 500 can proceed from block 518 to block 520. At block 520, the processor can compare the output current of the j-th column from the k-th read cycle with the maximum current set at block 508. In response to the output current being less than or equal to the maximum current, process 500 can proceed to block 524. In response to the output current being greater than the maximum current, process 500 can proceed to block 522. At block 522, the processor can update the maximum current that was set at block 508. By way of example, the processor can reduce the maximum current in block 522. Process 500 can proceed from block 522 to block 524.

At block 524, the processor can select a next current read cycle and process 500 can return to block 510 to continue to perform the remaining current read cycles and determine output distributions for updating the maximum current. At block 510, in response to k>K, process 500 can proceed to block 512. At block 512, the processor can compare the maximum current with a saturation current, or a percentage of the saturation current, of an ADC being used for reading out current from the j-th column in the analog memory device. In response to the maximum current being less than the saturation current of the ADC of the j-th column, process 500 can proceed to block 514. In response to the maximum current being greater than the saturation current of the ADC of the j-th column, process 500 can proceed to block 516. At block 516, the processor can reduce Gmax for the j-th column to adjust the conductance range of the j-th column. The reduction in block 516 can constrain the output current of the j-th column to be smaller than the saturation current of the ADC, despite the maximum current being greater than the saturation current. This constraint can cause the output current of the j-th column to be within a linear regime, and thus reduce errors produced by the ADCs. Process 500 can proceed from block 516 to block 514. At block 514, the processor can select a next column of unit cells and return to block 504.

The iterative approach of process 500 can allow system 300 to optimize conductance ranges without using specific optimization algorithms. System 300 of FIG. 3 can be configured to perform process 400 in FIG. 4 or process 500 to optimize conductance range of analog memory devices that are to be programmed with trained ML models.

Figure 6:
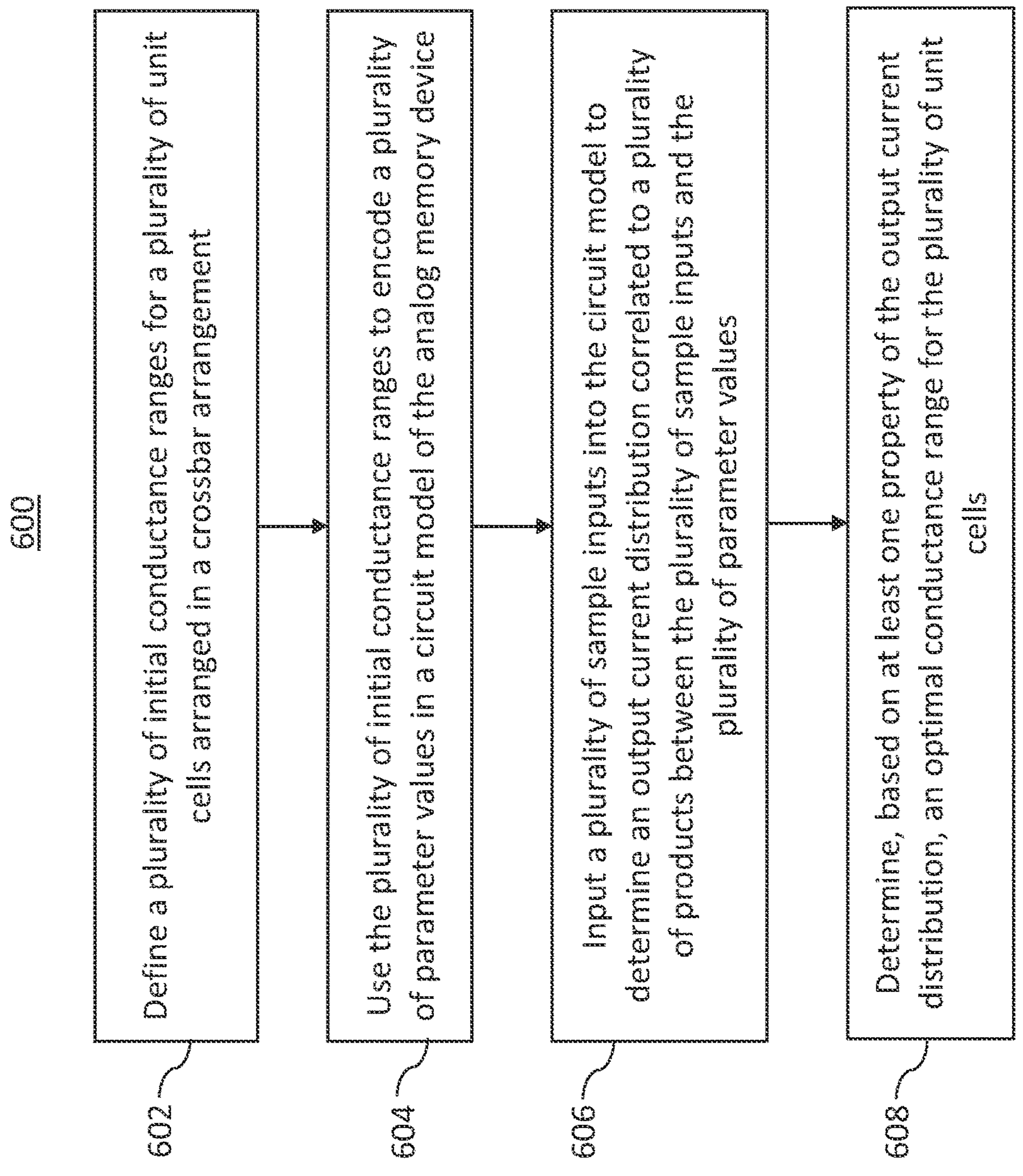
FIG. 6 is a flow diagram illustrating a method of performing conductance range optimization in one embodiment.

FIG. 6 is a flow diagram illustrating a method of performing conductance range optimization in one embodiment. The process shown in FIG. 6 may be implemented using, for example, system 300 discussed above. The process may include one or more operations, actions, or functions as illustrated by one or more of blocks. Although illustrated as discrete blocks, various blocks may be divided into additional blocks, combined into fewer blocks, eliminated, performed in different order, or performed in parallel, depending on the desired implementation.

Process 600 can be performed by system 300 shown in FIG. 3. Process 600 can begin at block 602. At block 602, a processor can define a plurality of initial conductance ranges for a plurality of unit cells arranged in a crossbar arrangement. The plurality of unit cells can include non-volatile memory (NVM) devices. An initial conductance range can be defined per column of unit cells in the crossbar arrangement.

Process 600 can proceed from block 602 to block 604. At block 604, the processor can use the plurality of initial conductance ranges to encode a plurality of parameter values in a circuit model of the analog memory device.

Process 600 can proceed from block 604 to block 606. At block 606, the processor can input a plurality of sample inputs into the circuit model to determine an output current distribution correlated to a plurality of products between the plurality of sample inputs and the plurality of parameter values. In one embodiment, the plurality of parameter values can represent parameters of a trained machine learning model. The processor can select an input distribution that best fits a training set of the trained machine learning model. The processor can further select the plurality of sample inputs from the input distribution. In one embodiment, the processor can select the plurality of sample inputs by applying a kernel density estimation technique on the training set. In one embodiment, the processor can select the plurality of sample inputs by selecting at least one of a subset of a training set used in training the trained machine learning model, a validation set used in an accuracy evaluation during training of the trained machine learning model and a test set used in performance evaluation of the trained machine learning model.

Process 600 can proceed from block 606 to block 608. At block 608, the processor can determine, based on at least one property of the output current distribution, an optimal conductance range for the plurality of unit cells. In one embodiment, the processor can determine the output current distribution comprises measuring an output current of every column of unit cells sequentially.

In one embodiment, the processor can determine the optimal conductance range by defining an objective corresponding to the output current distribution and an ADC connected to outputs of the plurality of unit cells. The processor can further compare the at least one property of the output current distribution with different current region boundaries of the ADC to obtain a difference. The processor can further update the optimal conductance range until the difference satisfies the objective.

In one embodiment, the processor can initialize a value of a maximum current. The processor can adjust the maximum current based on a difference between an output current of a column of unit cells and the maximum current. The processor can compare the adjusted maximum current with a saturation current of an ADC connected to outputs of the plurality of unit cells to obtain a difference. The processor can determine the optimal conductance range of the column of unit cells based on the difference.

In one embodiment, the processor can determine a respective optimal conductance range for each column of unit cells. In one embodiment, the processor can determine a respective optimal conductance range for different groups of columns of unit cells. In one embodiment, the processor can determine an optimal conductance range for an entirety of the plurality of unit cells.

In one embodiment, the processor can determine a product among a sum of conductance values of a subset of the plurality of unit cells that received a non-zero input among the plurality of input samples, a read voltage being used for reading output current from the plurality of unit cells, and a linear correlation coefficient. The processor can further approximate the output current distribution using the product.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "or" is an inclusive operator and can mean "and/or", unless the context explicitly or clearly indicates otherwise. It will be further understood that the terms "comprise". "comprises", "comprising", "include", "includes", "including", and/or "having." when used herein, can specify the presence of stated features, integers, steps, operations, elements, and/or components, but do not preclude the presence or addition of one or more other features, integers, steps, operations, elements, components, and/or groups thereof. As used herein, the phrase "in an embodiment" does not necessarily refer to the same embodiment, although it may. As used herein, the phrase "in one embodiment" does not necessarily refer to the same embodiment, although it may. As used herein, the phrase "in another embodiment" does not necessarily refer to a different embodiment, although it may. Further, embodiments and/or components of embodiments can be freely combined with each other unless they are mutually exclusive.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:

defining a plurality of initial conductance ranges for a plurality of unit cells arranged in a crossbar arrangement, wherein the plurality of unit cells comprises non-volatile memory (NVM) devices, a respective initial conductance range is defined for each column of unit cells in the crossbar arrangement, and an initial maximum conductance value of each one of the plurality of initial conductance ranges is dependent on a saturation current of an analog-to-digital converter (ADC) of a corresponding column of unit cells;

using the plurality of initial conductance ranges to encode a plurality of parameter values in a circuit model that simulates the plurality of unit cells;

inputting a plurality of sample inputs into the circuit model to determine an output current distribution correlated to a plurality of products between the plurality of sample inputs and the plurality of parameter values; and determining, based on at least one property of the output current distribution, an optimal conductance range for the plurality of unit cells.

2. The computer-implemented method of claim 1, wherein the plurality of parameter values represents parameters of a trained machine learning model, and the computer-implemented method further comprises:

selecting an input distribution that best fits a training set of the trained machine learning model; and selecting the plurality of sample inputs from the input distribution.

3. The computer-implemented method of claim 1, wherein the plurality of parameter values represents parameters of a trained machine learning model, and the computer-implemented method further comprises selecting the plurality of sample inputs by applying a kernel density estimation technique on a training set.

4. The computer-implemented method of claim 1, wherein the plurality of parameter values are parameters of a trained machine learning model, and the computer-implemented method comprises selecting the plurality of sample inputs by selecting at least one of:

a subset of a training set used in training the trained machine learning model;

a validation set used in an accuracy evaluation during training of the trained machine learning model; and a test set used in performance evaluation of the trained machine learning model.

5. The computer-implemented method of claim 1, wherein determining the output current distribution comprises measuring an output current of every column of unit cells sequentially.

6. The computer-implemented method of claim 1, wherein determining the optimal conductance range comprises:

defining an objective corresponding to the output current distribution and one or more ADCs connected to outputs of the plurality of unit cells;

comparing the at least one property of the output current distribution with different current region boundaries of the one or more ADCs to obtain a difference; and updating the optimal conductance range until the difference satisfies the objective.

7. The computer-implemented method of claim 1, further comprising:

initializing a value of a maximum current;

adjusting the maximum current based on a difference between an output current of a column of unit cells and the maximum current;

comparing the adjusted maximum current with a saturation current of an ADC connected to outputs of the plurality of unit cells to obtain a difference between the adjusted maximum current and the saturation current; and determining the optimal conductance range of the column of unit cells based on the difference between the adjusted maximum current and the saturation current.

8. The computer-implemented method of claim 1, wherein determining the optimal conductance range comprises at least one of:

determining a respective optimal conductance range for each column of unit cells;

determining a respective optimal conductance range for different groups of columns of unit cells; and determining an optimal conductance range for an entirety of the plurality of unit cells.

9. The computer-implemented method of claim 1, wherein determining the output current distribution comprises:

determining a product among:

a sum of conductance values of a subset of the plurality of unit cells that received a non-zero input among the plurality of sample inputs;

a read voltage being used for reading output current from the plurality of unit cells; and a linear correlation coefficient; and approximating the output current distribution using the product.

10. A system comprising:

a memory configured to store a plurality of parameters;

a processor configured to:

define a plurality of initial conductance ranges for a plurality of unit cells arranged in a crossbar arrangement, wherein the plurality of unit cells comprises non-volatile memory (NVM) devices, a respective initial conductance range is defined for each column of unit cells in the crossbar arrangement, and an initial maximum conductance value of each one of the plurality of initial conductance ranges is dependent on a saturation current of an analog-to-digital converter (ADC) of a corresponding column of unit cells;

use the plurality of initial conductance ranges to encode a plurality of parameter values in a circuit model that simulates the plurality of unit cells;

input a plurality of sample inputs into the circuit model to determine an output current distribution correlated to a plurality of products between the plurality of sample inputs and the plurality of parameter values; and determine, based on at least one property of the output current distribution, an optimal conductance range for the plurality of unit cells.

11. The system of claim 10, wherein the plurality of parameter values represents parameters of a trained machine learning model, and the processor is configured to determine the plurality of sample inputs based on at least one of:

a selection of an input distribution that best fits a training set of the trained machine learning model and a selection of the plurality of sample inputs from the input distribution;

an application of a kernel density estimation technique on the training set; and a selection of at least one of:

a subset of the training set;

a validation set used in an accuracy evaluation during training of the trained machine learning model; and a test set used in performance evaluation of the trained machine learning model.

12. The system of claim 10, wherein the processor is configured to measure an output current of every column of unit cells sequentially.

13. The system of claim 10, wherein the processor is configured to:

define an objective corresponding to the output current distribution and one or more ADCs connected to outputs of the plurality of unit cells;

compare the at least one property of the output current distribution with different current region boundaries of the one or more ADCs to obtain a difference; and update the optimal conductance range until the difference satisfies the objective.

14. The system of claim 10, wherein the processor is configured to:

initialize a value of a maximum current;

adjust the maximum current based on a difference between an output current of a column of unit cells and the maximum current;

compare the adjusted maximum current with a saturation current of an ADC connected to outputs of the plurality of unit cells to obtain a difference between the adjusted maximum current and the saturation current; and determine the optimal conductance range of the column of unit cells based on the difference between the adjusted maximum current and the saturation current.

15. The system of claim 10, wherein the processor is configured to:

determine a respective optimal conductance range for each column of unit cells;

determine a respective optimal conductance range for different groups of columns of unit cells; and determine an optimal conductance range for an entirety of the plurality of unit cells.

16. The system of claim 10, wherein the processor is configured to:

determine a product among:

a sum of conductance values of a subset of the plurality of unit cells that received a non-zero input among the plurality of sample inputs;

a read voltage being used for reading output current from the plurality of unit cells; and a linear correlation coefficient; and approximate the output current distribution using the product.

17. A computer program product comprising a computer readable storage medium having program instructions embodied therewith, the program instructions readable by a device to cause the device to:

define a plurality of initial conductance ranges for a plurality of unit cells arranged in a crossbar arrangement, wherein the plurality of unit cells comprises non-volatile memory (NVM) devices, a respective initial conductance range is defined for each column of unit cells in the crossbar arrangement, and an initial maximum conductance value of each one of the plurality of initial conductance ranges is dependent on a saturation current of an analog-to-digital converter (ADC) of a corresponding column of unit cells;

use the plurality of initial conductance ranges to encode a plurality of parameter values in a circuit model that simulates the plurality of unit cells;

input a plurality of sample inputs into the circuit model to determine an output current distribution correlated to a plurality of products between the plurality of sample inputs and the plurality of parameter values; and determine, based on at least one property of the output current distribution, an optimal conductance range for the plurality of unit cells.

18. The computer program product of claim 17, wherein the plurality of parameter values stored in the plurality of unit cells are weights of a trained machine learning model, and the device is further caused to determine the plurality of sample inputs based on:

a selection of an input distribution that best fits a training set of the trained machine learning model and a selection of the plurality of sample inputs from the input distribution;

an application of a kernel density estimation technique on the training set; and a selection of at least one of:

a subset of the training set;

a validation set used in an accuracy evaluation during training of the trained machine learning model; and a test set used in performance evaluation of the trained machine learning model.

19. The computer program product of claim 17, wherein the device is further caused to:

define an objective corresponding to the output current distribution and one or more ADCs connected to outputs of the plurality of unit cells;

compare the at least one property of the output current distribution with different current region boundaries of the one or more ADCs to obtain a difference; and update the optimal conductance range until the difference satisfies the objective.

20. The computer program product of claim 17, wherein the device is further caused to:

determine a respective optimal conductance range for each column of unit cells;

determine a respective optimal conductance range for different groups of columns of unit cells; and determine an optimal conductance range for an entirety of the plurality of unit cells.

* * * * *